United States Patent
Lee

(10) Patent No.: US 7,358,560 B2
(45) Date of Patent: Apr. 15, 2008

(54) FLASH MEMORY DEVICE AND METHOD OF MANUFACTURING THE SAME

(75) Inventor: Keun Woo Lee, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 54 days.

(21) Appl. No.: 11/479,444

(22) Filed: Jun. 30, 2006

(65) Prior Publication Data

US 2007/0145456 A1   Jun. 28, 2007

(30) Foreign Application Priority Data

Dec. 28, 2005   (KR) .................. 10-2005-0131335

(51) Int. Cl.
*H01L 29/788* (2006.01)
(52) U.S. Cl. .............. 257/315; 257/316; 257/503; 257/508; 257/E29.304
(58) Field of Classification Search ........ 257/314–316, 257/503, 508, E29.304, E21.628; 438/257, 438/430
See application file for complete search history.

(56) References Cited

U.S. PATENT DOCUMENTS

| | | | |
|---|---|---|---|
| 5,859,466 A * | 1/1999 | Wada | 257/508 |
| 6,552,435 B2 * | 4/2003 | Noble | 257/773 |
| 6,897,516 B2 * | 5/2005 | Mehrad et al. | 257/315 |
| 7,170,786 B2 * | 1/2007 | Chien et al. | 365/185.17 |
| 2006/0138522 A1 * | 6/2006 | Kim | 257/315 |
| 2006/0246657 A1 * | 11/2006 | Kim et al. | 438/243 |
| 2007/0228450 A1 * | 10/2007 | Li et al. | 257/315 |

* cited by examiner

*Primary Examiner*—T. N. Quach
(74) *Attorney, Agent, or Firm*—Townsend and Townsend and Crew LLP

(57) ABSTRACT

A non-volatile memory device includes a semiconductor substrate having an active region defined by isolation films that extend along a first direction. A control gate line extends along in a second direction perpendicular to the first direction. First and second floating gates are formed on the active region and below the control gate line. An island conductive line is formed between the first and second floating gates and within the isolation films. The island conductive line extends along the first direction and is configured to receive a voltage in order to prevent interference between the first and second floating gates.

6 Claims, 6 Drawing Sheets

FLASH MEMORY DEVICE AND METHOD OF MANUFACTURING THE SAME

BACKGROUND

The present invention generally relates to semiconductor memory devices, and more particularly, to a flash memory device and a method of manufacturing the same, in which an interference phenomenon can be reduced.

As the level of integration of NAND flash memories becomes high, the influence of cells adjacent to a programmed cell on the programmed cell is gradually increased.

Capacitance exists between cells that are adjacent to each other in a bit line direction (or x direction), a word line direction (or y direction), and a xy direction. The capacitance gradually increases as the distance between the cells becomes smaller as the level of integration of devices becomes higher. More particularly, the capacitance is significantly increased when the cells shrink in the x direction.

As a result, as the coupling ratio is reduced, the program speed is lowered and the interference phenomenon is increased.

The term "interference phenomenon" refers to a phenomenon in which if a neighboring cell to a to-be read cell is to be programmed, a threshold voltage of a cell, which is higher than an actual threshold voltage, is read due to the capacitance effect of an adjacently programmed cell during the read operation of a next cell because of variation in the charge of the floating gates of the neighboring cell. In this case, the charge itself of the floating gate of the to-be read cell is not changed, but the status of an actual cell looks distorted due to variation in the status of the neighboring cell.

This distortion phenomenon widens the distributions of cells and, therefore, makes it difficult to control the cells. More particularly, the influence is significantly greater in multi-level cells having a small cell distribution margin than in single-level cells.

To improve the cell uniformity, it is necessary to reduce the interference phenomenon.

SUMMARY OF THE INVENTION

An embodiment of the present invention provides a flash memory device and a method of manufacturing the same, in which the interference phenomenon can be reduced.

Another embodiment of the present invention provides a flash memory device and a method of manufacturing the same, in which an operational malfunction can be prevented through the reduction of the cell distributions.

Still another embodiment of the present invention provides a flash memory device and a method of manufacturing the same, in which multi-level cells having a small cell distribution margin can be fabricated through the reduction of the cell distributions.

Another embodiment of the present invention provides a flash memory device and a method of manufacturing the same, in which the program speed can be enhanced.

Still another embodiment of the present invention provides a flash memory device and a method of manufacturing the same, in which devices of a high integration level can be fabricated by reducing the interference phenomenon serving to limit the high integration.

According to one embodiment of the present invention, a flash memory device comprises a memory cell, the memory cell including a semiconductor substrate having active regions defined by isolation films arranged in one direction, control gate lines arranged in a direction perpendicular to the isolation films, floating gates formed on the active regions below the control gate lines, and island polysilicon lines formed within the isolation films in the same direction as that of the isolation films and applied with a voltage in order to prevent the interference between neighboring floating gates with the isolation films therebetween.

According to another embodiment of the present invention, a method of manufacturing a flash memory device comprises etching a semiconductor substrate resulting in a plurality of isolation trenches arranged in one direction; forming a first insulating layer on the semiconductor substrate, the first insulating layer having grooves within the isolation trenches of the semiconductor substrate; forming island polysilicon lines at the bottoms of the grooves; forming a second insulating layer so that the isolation trenches are completely buried, and stripping the second insulating layer and the first insulating layer so that the semiconductor substrate is exposed, forming isolation films within the isolation trenches; forming tunnel oxide films on active regions defined by the isolation films; forming floating gates on the tunnel oxide films; and forming a control gate on the entire structure with a dielectric layer intervened therebetween.

According to another embodiment of the present invention, a method of manufacturing a flash memory device comprises forming a tunnel oxide film and a first polysilicon layer on a semiconductor substrate; etching the first polysilicon layer, the tunnel oxide film, and a part of the semiconductor substrate, resulting in a plurality of isolation trenches arranged in one direction; forming a first insulating layer on the entire structure, the first insulating layer having grooves within the isolation trenches; forming island polysilicon lines at the bottoms of the grooves; forming a second insulating layer so that the isolation trenches are fully buried, and stripping the second insulating layer and the first insulating layer so that the first polysilicon layer is exposed, thereby forming isolation films within the isolation trenches; forming second polysilicon layers on the first polysilicon layer and the isolation films adjacent to the first polysilicon layer, thereby forming floating gates respectively having lamination film of the first polysilicon layer and the second polysilicon layer; and forming a control gate on the entire structure including the floating gates with a dielectric layer intervened therebetween.

In another embodiment, a non-volatile memory device includes a semiconductor substrate having an active region defined by isolation films that extend along a first direction. A control gate line extends along in a second direction perpendicular to the first direction. First and second floating gates are formed on the active region and below the control gate line. An island conductive line is formed between the first and second floating gates and within the isolation films. The island conductive line extends along the first direction and is configured to receive a voltage in order to prevent interference between the first and second floating gates.

In another embodiment, a method of manufacturing a non-volatile memory device includes etching a semiconductor to form a trench; providing a first insulating layer within the first trench without completely filling the trench, so that a groove is formed within the trench; providing a conductive layer within the groove, so that the conductive layer remains only at a lower portion of the groove to define an island conductive line; forming a second insulating layer within the groove and over the island conductive line, wherein the first and second insulating layers define an isolation structure, the island conductive line being provided within the isolation structure; forming first and second floating gates on first and second sides of the isolation structure, so that the isolation structure is provided between the first and second floating gates; and forming a control gate line over the first and second floating gates.

In yet another embodiment, a method of manufacturing a non-volatile memory device includes forming a tunnel oxide film and a first polysilicon layer on a semiconductor substrate; etching the first polysilicon layer, the tunnel oxide film, and a portion of the semiconductor substrate to form an isolation trench arranged in a first direction; forming a first insulating layer within the isolation trench to form a groove defined by the first insulating layer; forming an island polysilicon line at a lower portion of the groove; forming a second insulating layer within the groove and over the island polysilicon line to define an isolation structure, the isolation structure including the first and second insulation layers, the island polysilicon layer being provided within the isolation structure; forming second polysilicon layer on the first polysilicon layer to form a floating gate having a lamination film of the first polysilicon layer and the second polysilicon layer; and forming a control gate over the second polysilicon layer.

BRIEF DESCRIPTION OF THE DRAWINGS

A more complete appreciation of the invention will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

Figure 1:
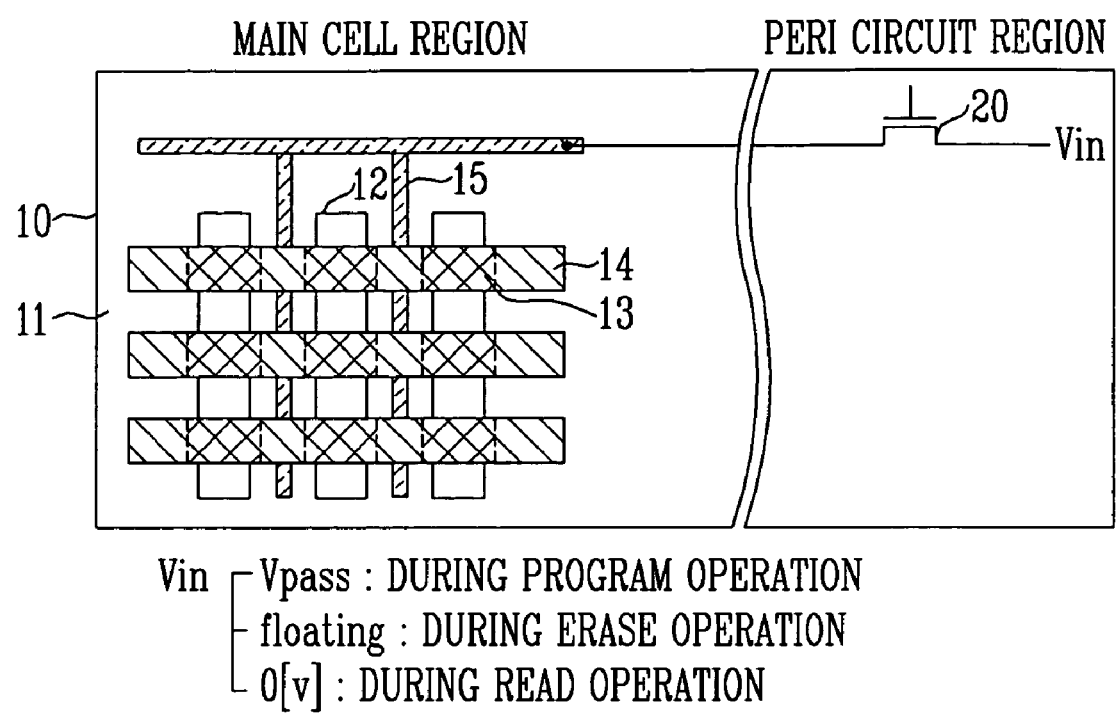
FIG. 1 is a view illustrating the construction of a flash memory device according to an embodiment of the present invention.

FIG. 1 is a view illustrating the construction of a flash memory device according to an embodiment of the present invention.

Referring to FIG. 1, a flash memory cell according to an embodiment of the present invention includes a semiconductor substrate 10 in which active regions 12 are defined by isolation films 11 arranged in a first direction, control gate lines 14 arranged in a second direction perpendicular to the first direction, floating gates 13 formed on the active region 12 below the control gate lines 14, and island polysilicon lines 15 formed within the isolation films 11 along the first direction as with the isolation films 11 and applied with a voltage in order to prevent the interference between the floating gates 13.

Though not shown in the drawing, tunnel oxide films are disposed between the floating gates 13 and the semiconductor substrate 10 and gate dielectric films are disposed between the floating gates 13 and the control gate lines 14.

The island polysilicon lines 15 are interconnected at the edge region of the memory cell so that the island polysilicon lines 15 can be applied with the same voltage.

Meanwhile, switching circuit 20 for supplying a voltage to the island polysilicon lines 15 is included in a peripheral region for driving the memory cell.

In some embodiments, the switching circuit 20 is a MOS transistor that is turned on during the program, erase, and read operations of the memory cell. The switching transistor 20 has one end to which an input voltage Vin is input and the other end connected to the island polysilicon lines 15, so that when the memory cell is driven, Vin can be transmitted to the island polysilicon lines 15.

The input voltage Vin may have different voltage values depending on the operating status of a memory cell so that there is no potential between the island polysilicon lines 15 and the floating gates of neighboring cells.

In the program operation, a pass voltage applied to a control gate of a non-selected memory cell is used as Vin, and in the erase operation, no voltage is applied so that the island polysilicon lines 15 are floated. Meanwhile, in the read operation, a voltage of 0V is used as Vin.

FIGS. 2A to 2F are cross-sectional views illustrating a method of manufacturing a flash memory cell according one embodiment of the present invention. FIGS. 2A to 2F illustrate an example in which the present invention is applied to a typical Shallow Trench Isolation (STI) structure.

Figure 2A:
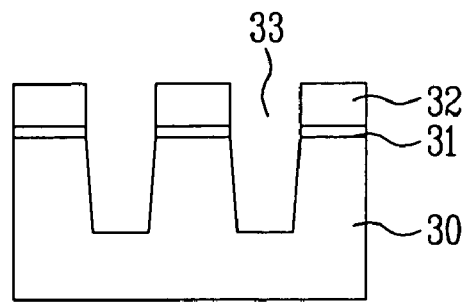
FIGS. 2A to 2F are cross-sectional views illustrating a method of manufacturing a flash memory cell according to an embodiment of the present invention.

Referring first to FIG. 2A, a pad oxide film 31 and a pad nitride film 32 are sequentially formed on a semiconductor substrate 30. The pad nitride film 32, the pad oxide film 31, and a part of the semiconductor substrate 30 are etched by a photolithography process, forming a plurality of isolation trenches 33 extending along one direction. The etched depth of the semiconductor substrate 30 may be set to about 2000 Å.

Figure 2B:
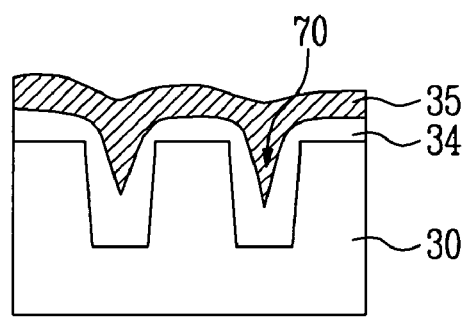

Referring to FIG. 2B, the pad nitride film 32 and the pad oxide film 31 are removed. A High Density Plasma (HDP) oxide film is then deposited on the entire structure to form a first insulating layer 34. In this case, the thickness of the first insulating layer 34 is properly controlled so that a groove 70 is formed within each of the trenches 33 in such a manner that the trenches 33 are not fully filled. The groove 70 has a valley-like shape in the present embodiment.

Figure 2C:
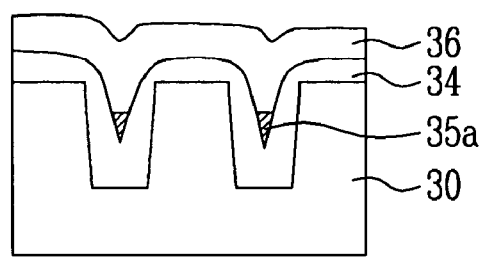

A polysilicon layer 35 is deposited on the entire structure. The polysilicon layer 35 is etched back, so that it remains only at a lower portion of the groove 70 as shown in FIG. 2C, thereby forming island polysilicon lines 35a.

Figure 2D:
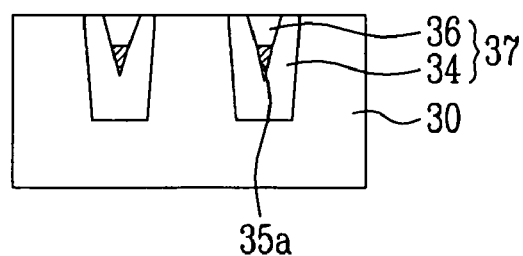

Thereafter, a HDP oxide film is deposited on the entire structure, forming a second insulating layer 36. Chemical Mechanical Polishing (CMP) is performed on the second insulating layer 36 and the first insulating layer 34 so that the semiconductor substrate 30 is exposed, as shown in FIG. 2D. Accordingly, isolation films 37 respectively having the first and second insulating layers 34, 36 and the island polysilicon line 35a at the bottom are formed.

Figure 2E:
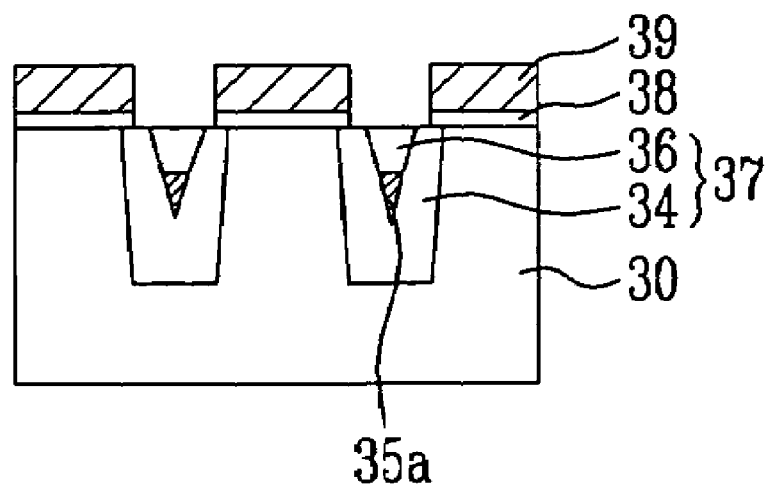

Referring to FIG. 2E, polysilicon layers 39 for floating gates are formed on the active region defined by the isolation films 37 and the isolation films 37 adjacent to the active regions. Tunnel oxide films 38 are between the polysilicon layers 39 and the substrate 30.

Figure 2F:
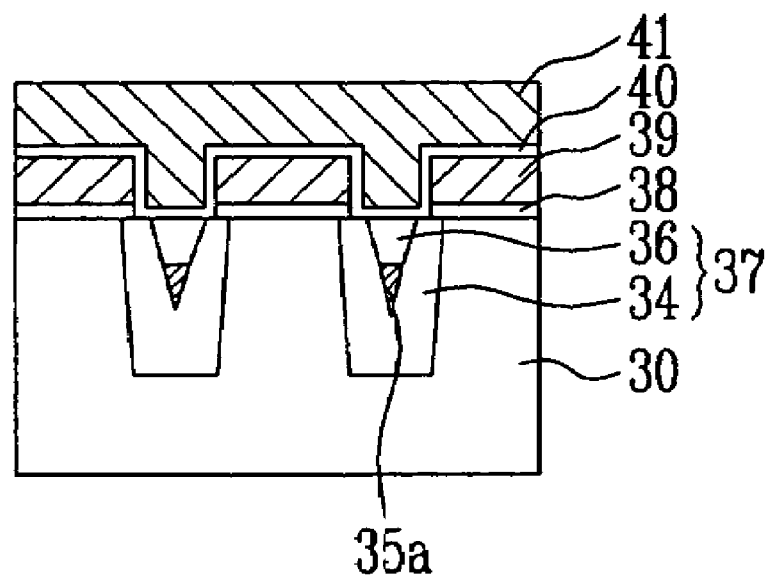

Referring to FIG. 2F, a dielectric layer 40 and a polysilicon layer 41 for a control gate are sequentially formed on the entire structure.

Though not shown in the drawings, the polysilicon layer 41, the dielectric layer 40, the polysilicon layer 39, and the tunnel oxide film 38 are etched in a direction orthogonal to the direction in which the isolation films 37 are arranged, forming a stack gate having the tunnel oxide film, the floating gates, the dielectric layer, and the control gate. Subsequent processes are performed to complete the flash memory cell.

FIGS. 3A to 3J are cross-sectional views illustrating a method of manufacturing a flash memory cell according to another embodiment of the present invention. FIGS. 3A to 3J illustrate an example in which the present invention is applied to a Self-Aligned Shallow Trench Isolation (SA-STI) structure.

Figure 3A:
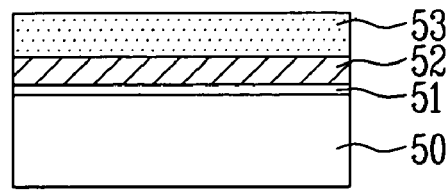
FIGS. 3A to 3J are cross-sectional views illustrating a method of manufacturing a flash memory cell according to another embodiment of the present invention.

Referring to FIG. 3A, a tunnel oxide film 51, a first polysilicon layer 52, and a hard mask film 53 are sequentially formed on a semiconductor substrate 50. The hard mask film 53 may be formed using a nitride film.

Figure 3B:
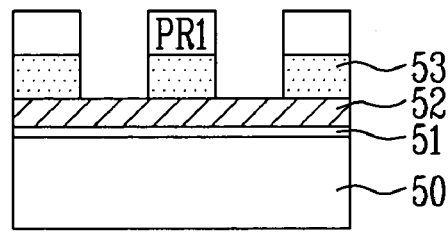

A first photoresist PR1 is then formed on the entire structure. The first photoresist PR1 is patterned to open a field region, as shown in FIG. 3B. The hard mask film 53 is patterned by an etch process using the patterned first photoresist PR1 as a mask.

Figure 3C:
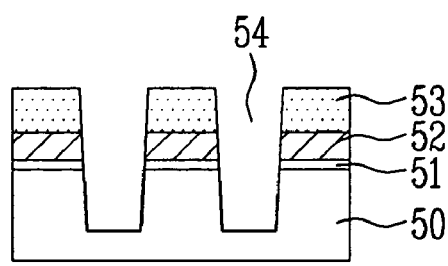

Thereafter, as shown in FIG. 3C, the first photoresist PR1 is stripped in order to prevent etch failure by the first photoresist PR1 in a subsequent etch process.

A plurality of isolation trenches 54 is formed by etching the first polysilicon layer 52, the tunnel oxide film 51, and a portion of the semiconductor substrate 50 using the patterned hard mask film 53 as a mask. The isolation trenches are formed to extend along a first direction. The etched depth of the semiconductor substrate 50 may be set to about 2000 Å.

Figure 3D:
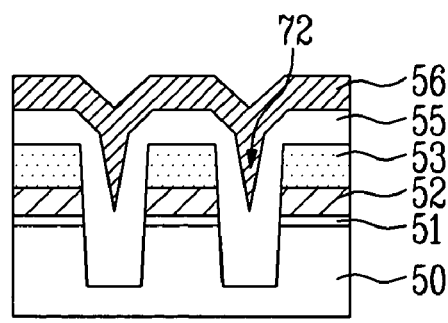

Referring to FIG. 3D, a HDP oxide film is deposited on the entire structure to form a first insulating layer 55. A groove 72 is formed by controlling the thickness of the first insulating layer 55.

Figure 3E:
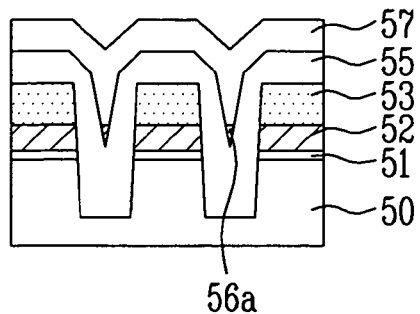

A second polysilicon layer 56 is deposited on the entire structure. The second polysilicon layer 56 is etched back so that the second polysilicon layer 56 remains only at a lower portion of each groove 72, as shown in FIG. 3E, thereby forming an island polysilicon line 56a. A HDP oxide film is then deposited on the entire structure so that the trenches 54 are fully filled, thus forming a second insulating layer 57.

Figure 3F:
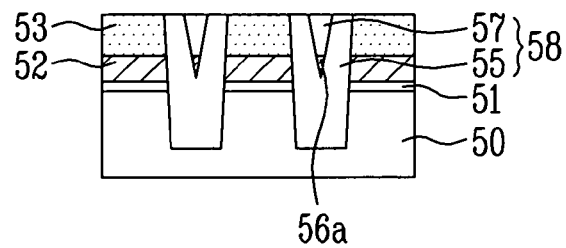

Referring to FIG. 3F, the second insulating layer 57 and the first insulating layer 55 are stripped by CMP so that the first polysilicon layer 52 is exposed, thereby forming isolation films 58. Each of the isolation films 58 has the first and second insulating layers 55, 57 and has an island polysilicon line 56a at the bottom of the groove 72.

Figure 3G:
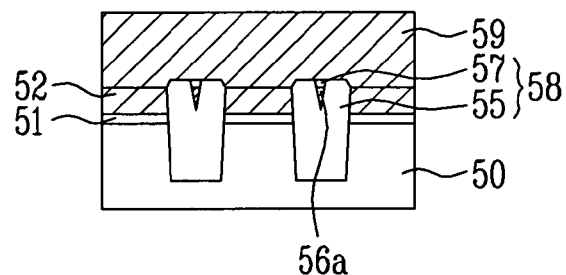
Figure 3H:
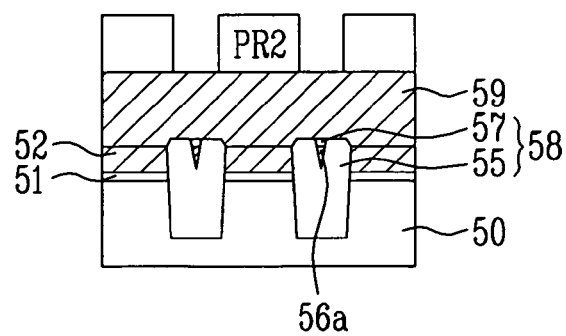

Referring to FIG. 3G, a third polysilicon layer 59 is formed on the entire structure. A second photoresist PR2 is coated on the third polysilicon layer 59 as shown in FIG. 3H. The second photoresist PR2 is patterned so that the third polysilicon layer 59 on the isolation films 58 is exposed.

Figure 3I:
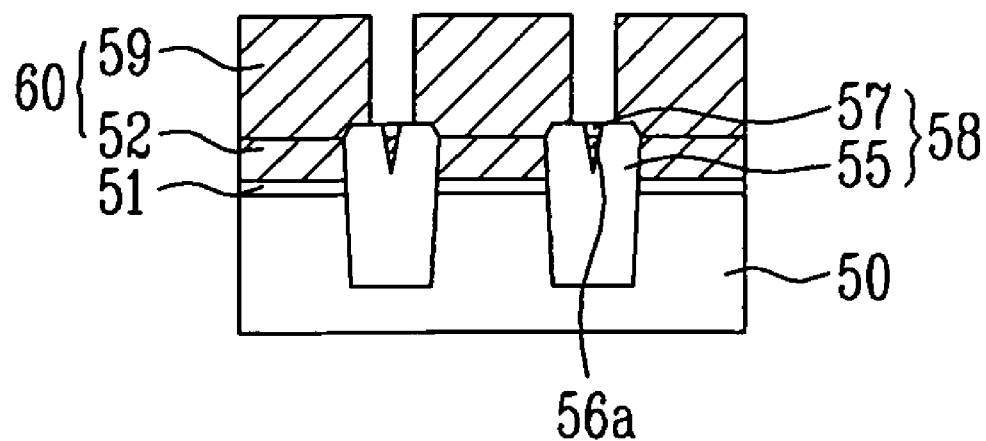

Referring to FIG. 3I, the third polysilicon layer 59 is etched using the patterned second photoresist PR2 as a mask, forming floating gate patterns 60. Each floating gate 60 has a lamination film of the first polysilicon layer 52 and the third polysilicon layer 59. The second photoresist PR2 is stripped from the third polysilicon layer 59.

Figure 3J:
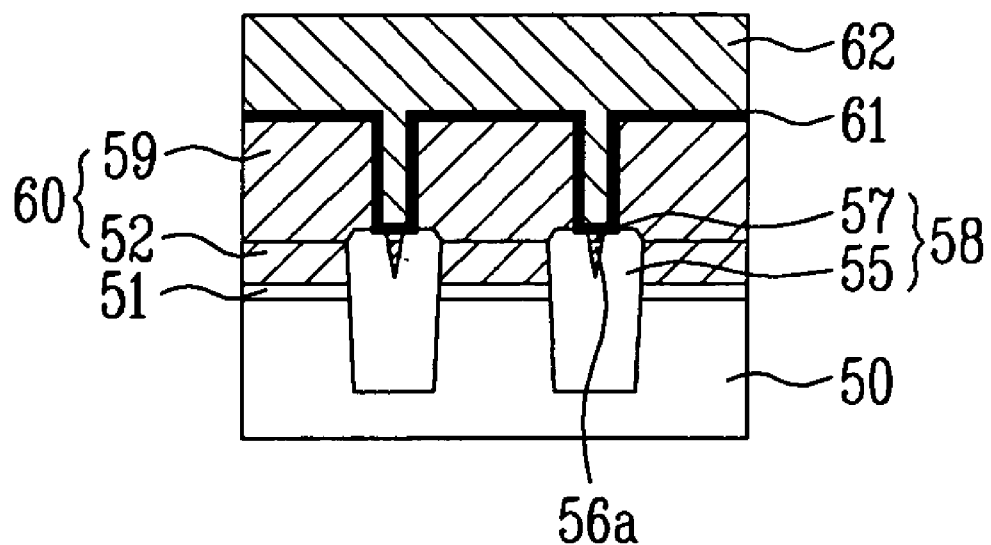

Referring to FIG. 3J, a dielectric layer 61 and a polysilicon layer 62 for a control gate are formed on the entire structure.

Thereafter, though not shown in the drawings, the polysilicon layer 62 for the control gate, the dielectric layer 61, the floating gate the patterns 60 and the tunnel oxide film 51 are etched in a direction orthogonal to the direction in which the isolation films 58 are arranged, thereby forming a stack gate having the tunnel oxide film, the floating gates, the dielectric layer and the control gate. Subsequent processes are performed to complete the flash memory cell. As described above, the embodiments of the present invention has one or more of the following advantages. First, since the interference phenomenon can be reduced, the limit to the level of integration of devices due to the interference phenomenon can be overcome. It is therefore possible to enhance the level of integration of devices. Second, since the interference phenomenon can be reduced, cell distributions can be reduced and device operation failure can be prevented accordingly. Third, since the cell distributions can be reduced, multi-level cells having a small cell distribution margin can be fabricated. Fourth, since the interference phenomenon can be reduced, the coupling ratio can be increased and the program speed can be enhanced.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A non-volatile memory device, comprising:
    a semiconductor substrate having an active region defined by isolation films that extend along a first direction;
    a control gate line extending along in a second direction perpendicular to the first direction;
    first and second floating gates formed on the active region and below the control gate line; and
    an island conductive line formed between the first and second floating gates and within the isolation films, the island conductive line extending along the first direction and being configured to receive a voltage in order to prevent interference between the first and second floating gates.

2. The non-volatile memory device as claimed in claim 1, wherein the island conductive line is connected to an edge portion, the edge portion being connected to at least one other island conductive line, wherein the island conductive line is a polysilicon line.

3. The non-volatile memory device as claimed in claim 1, further comprising a switching device at a peripheral region of the device, the switching device being configured to apply a voltage to the island conductive line during a program operation.

4. The non-volatile memory device as claimed in claim 1, wherein the device has a first memory cell that is selected and a second memory cell that is not selected during a program operation, wherein a voltage applied to the island conductive line during the program operation is the same as that applied to a control gate of the second memory cell.

5. The non-volatile memory device as claimed in claim 1, wherein the island conductive line is floated during an erase operation.

6. The non-volatile memory device as claimed in claim 1, wherein a voltage of 0V is applied to the island conductive line during a read operation.

* * * * *